United States Patent
Wang et al.

(10) Patent No.: US 9,455,696 B2
(45) Date of Patent: Sep. 27, 2016

(54) PULSE FREQUENCY MODULATION CIRCUIT AND POWER ADAPTER

(71) Applicant: General Luminaire Co., Ltd., Taipei (TW)

(72) Inventors: Yung-Hong Wang, Taipei (TW); Zhi-Jian Fan, Shanghai (CN)

( * ) Notice: Subject to any disclaimer, the term of this patent is extended or adjusted under 35 U.S.C. 154(b) by 150 days.

(21) Appl. No.: 14/312,698

(22) Filed: Jun. 24, 2014

(65) Prior Publication Data

US 2015/0372669 A1     Dec. 24, 2015

(51) Int. Cl.
| | |
|---|---|
| *H02M 3/335* | (2006.01) |
| *H03K 7/06* | (2006.01) |
| *H02M 5/458* | (2006.01) |
| *H02M 1/00* | (2006.01) |

(52) U.S. Cl.
CPC ............... *H03K 7/06* (2013.01); *H02M 1/00* (2013.01); *H02M 3/33515* (2013.01); *H02M 5/458* (2013.01); *H02M 2001/0003* (2013.01); *H02M 2001/0022* (2013.01)

(58) Field of Classification Search
CPC .......... H02M 3/22; H02M 3/24; H02M 3/28; H02M 3/325; H02M 3/335; H02M 3/33507; H02M 3/33515; H02M 3/33523; H02M 3/33538; H02M 3/33546; H02M 3/33553; H02M 2001/0003; H02M 2001/0012; H02M 5/458; H02M 2001/0022; H03K 7/06
USPC ...... 363/15, 18, 19, 20, 21.01, 21.12, 21.13, 363/21.18; 315/219; 332/112, 113, 117, 332/135
See application file for complete search history.

(56) References Cited

U.S. PATENT DOCUMENTS

| | | | | |
|---|---|---|---|---|
| 2006/0158912 A1* | 7/2006 | Wu | ...................... | H02M 1/4225 363/89 |
| 2010/0315840 A1* | 12/2010 | Cohen | ............... | H02M 3/33507 363/21.04 |
| 2012/0281438 A1* | 11/2012 | Fang | .................. | H02M 3/33515 363/21.12 |

(Continued)

OTHER PUBLICATIONS

Zhang, J.F.; Shteynberg, A.; Zhou, D.; McCreary, J., "A novel multimode digital control approach for single-stage flyback power supplies with power factor correction and fast output voltage regulation," in Applied Power Electronics Conference and Exposition, 2005. APEC 2005. Twentieth Annual IEEE, vol. 2, No., pp. 830-836 vol. 2, Mar. 6-10, 2005.*

(Continued)

*Primary Examiner* — Adolf Berhane
*Assistant Examiner* — Jye-June Lee

(57) ABSTRACT

Disclosed are a pulse frequency modulation circuit and a power adapter. The pulse frequency modulation circuit includes a first multiplier, a second multiplier, a third multiplier, a divider and an adder sequentially and electrically connected to one another. The second multiplier includes an output terminal connected to an input terminal of the divider, a first input terminal, and a second input terminal connected to an input terminal circuit of the adder. To prevent the uncertain timing of the critical operating status of the time control circuit detected by the conventional zero-crossing detection method, the pulse frequency modulation circuit and power adapter adopt the pulse frequency modulation circuit for computation and output a control signal to control the OFF/ON time of a transistor in the power adapter, so as to control the timing of the operating status of the power adapter precisely.

8 Claims, 3 Drawing Sheets

(56) References Cited

U.S. PATENT DOCUMENTS

2012/0306394 A1* 12/2012 Ikeda .................. G05F 1/44
363/15
2013/0215649 A1* 8/2013 Huang .............. H02M 3/33523
363/21.17

OTHER PUBLICATIONS

Datasheet "iW2202 Digital Single-stage PFC Controller", iWatt Inc., Oct. 2004.*

* cited by examiner

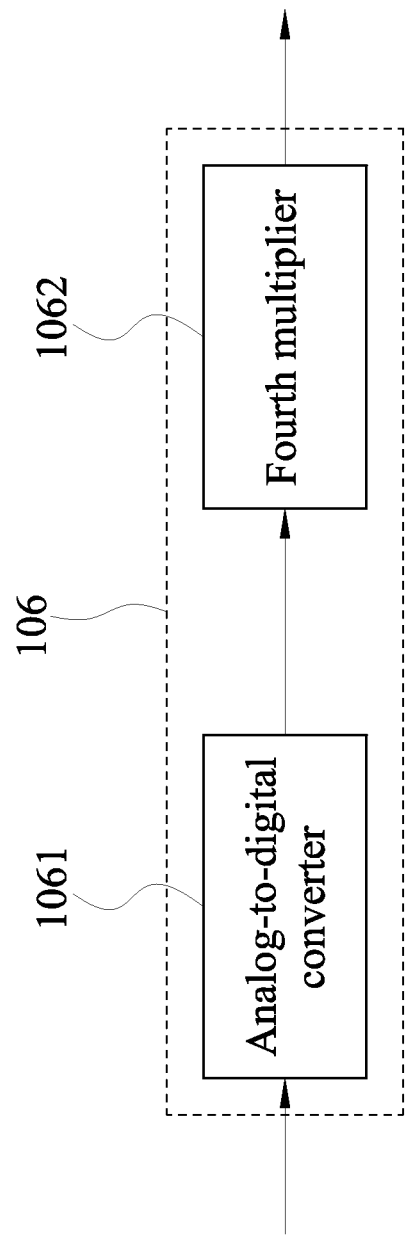

US 9,455,696 B2

PULSE FREQUENCY MODULATION CIRCUIT AND POWER ADAPTER

BACKGROUND OF THE INVENTION

1. Field of the Invention

The present invention relates to the field of electronic technology, and more particularly to a power frequency modulation (PFM) circuit and a power adapter of an electronic device such as a liquid crystal display (LCD), a television (TV) or a light emitting diode (LED) lamp.

2. Description of the Related Art

To provide an appropriate and stable power to an electronic device, the electronic device is usually equipped with a power adapter. In general, a conventional power adapter controls the connection of a MOS tube by detecting a zero crossing of a secondary current. If the ON time of the MOS tube is a default time, the MOS tube is controlled to be disconnected, so that the critical operating mode of the power adapter can be achieved by detecting the zero crossing of current by a hardware circuit. However, the conventional methods are unable to control the time of the zero crossing of current precisely or the ON time of the MOS tube, so that the timing for switching the operating status of a power adapter cannot be controlled precisely.

SUMMARY OF THE INVENTION

Therefore, it is a primary objective of the present invention to overcome the drawbacks of the prior art by providing a pulse frequency modulation (PFM) circuit and a power adapter for controlling the switching time of the operating status of the power adapter precisely.

To achieve the aforementioned and other objectives, the present invention provides a pulse frequency modulation circuit comprising a first multiplier (101), a second multiplier (105), a third multiplier (104), a divider (102) and an adder (103) sequentially and electrically coupled to one another, wherein an output terminal of the second multiplier (105) is coupled to another input terminal of the divider (102); the second multiplier (105) has a first input terminal and a second input terminal; and a second input terminal of the second multiplier (105) is coupled to another input terminal circuit of the adder (103).

To achieve the aforementioned and other objectives, the present invention provides a power adapter comprising a power adapter circuit and the aforementioned pulse frequency modulation circuit, wherein the power adapter circuit comprising a sample module (500), a control module (400) and a filter and a rectifier module, a power conversion module (300) and an output module sequentially and electrically coupled to one another; the pulse frequency modulation circuit has two input terminals connected to the sample module (500); and the pulse frequency modulation circuit has an output terminal, a control module (400) and a power conversion module (300) sequentially and electrically coupled to one another.

To prevent the uncertain timing of the critical operating status of the time control circuit detected by the conventional zero-crossing detection method, the pulse frequency modulation circuit and power adapter of the present invention use the pulse frequency modulation circuit for computation and output a control signal to control the OFF/ON time of a transistor in the power adapter, so as to control the timing of the operating status of the power adapter precisely.

BRIEF DESCRIPTION OF THE DRAWINGS

FIG. 3 is a schematic circuit diagram of a signal conversion circuit in accordance with the first preferred embodiment of the present invention.

DETAILED DESCRIPTION OF THE PREFERRED EMBODIMENTS

The technical content of the present invention will become apparent with the detailed description of preferred embodiments and the illustration of related drawings as follows. It is noteworthy that the preferred embodiments are provided for illustrating the present invention, but not intended for limiting the scope of the invention.

Figure 1:
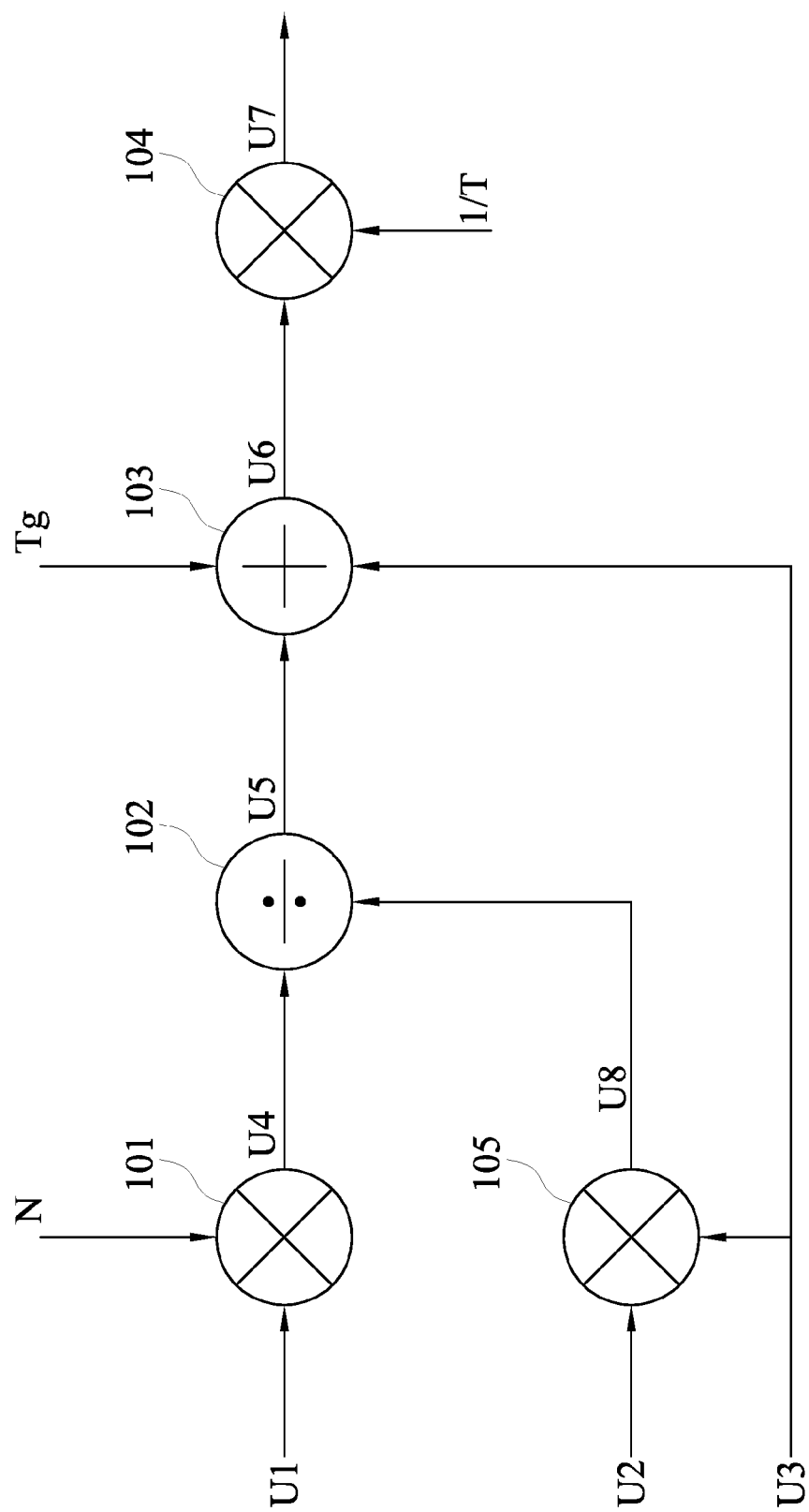
FIG. 1 is a schematic circuit diagram of a pulse frequency modulation circuit in accordance with a first preferred embodiment of the present invention.

With reference to FIG. 1 for a pulse frequency modulation circuit in accordance with the first preferred embodiment of the present invention, the pulse frequency modulation circuit comprises a first multiplier 101, a second multiplier 105, a third multiplier 104, a divider 102 and an adder 103 sequentially and electrically coupled to one another, wherein an output terminal of the second multiplier 105 is coupled to another input terminal of the divider 102; the second multiplier 105 has a first input terminal and a second input terminal; and the second input terminal of the second multiplier 105 is coupled to an input terminal circuit of the adder 103. Persons having ordinary skill in the art could understand that the input terminal of the first multiplier 101 and the first and second input terminals of the second multiplier 105 may be coupled to different output terminals of the power adapter for inputting corresponding electrical signals; and an output terminal of the third multiplier 104 is coupled to a control port of the power adapter and provided for outputting signals to control and switch the operating status of the power adapter for the pulse frequency modulation circuit of the first preferred embodiment of the invention.

Persons having ordinary skill in the art could understand that the first input terminal of the first multiplier 101 receives a first electrical signal U1 (having a value of dc) transmitted from the power adapter, and the second receiving terminal of the first multiplier 101 receives a second electrical signal (having a value of Un which is equal to the number of turns) transmitted from the power adapter, and the first multiplier 101 performs a multiplication to obtain a fourth electrical signal U4 (having a value of dc×N); the first input terminal of the second multiplier 105 receives a second electrical signal U2 (having a value of in) transmitted from the power adapter, and the second input terminal of the second multiplier 105 receives a third electrical signal U3 (having a value of ton) transmitted from the power adapter, and the second multiplier 105 performs a multiplication to obtain the eighth electrical signal U8 (having a value of in×ton); the fourth electrical signal U4 and the eighth electrical signal U8 are divided by the divider 102 to obtain a fifth electrical signal U5 (having a value of Toff, and Toff=dc×N/in/ton), and the fifth signal U5 acts as the time control signal for turning off the power adapter, and its value represents the length of the OFF time; the first input terminal of the adder 103 receives a fifth electrical signal U5 outputted from the divider 102, and the second input terminal of the adder 103 receives the third electrical signal U3 and perform an addition with the fixed OFF time signal Tg to output a sixth electrical signal U6 (having a value of T which represents the control cycle of the power adapter, and the third multiplier performs a reciprocal operation of the sixth signal U6 to obtain a seventh electrical signal U7 (having a value of F which represents the control frequency of the power adapter. This preferred embodiment provides a pulse frequency modulation circuit for transmitting the seventh electrical signal U7 to the control terminal of the power adapter to control the ON/OFF time of the power adapter precisely.

In FIG. 3, the pulse frequency modulation circuit of this preferred embodiment further comprises a signal conversion circuit 106 specifically including an analog-to-digital converter 1061 and a fourth multiplier 1062 connected in series with each other, and the analog-to-digital converter 1061 has an input terminal coupled to an output terminal of the power adapter; an output terminal of the fourth multiplier 1062 is coupled to a first input terminal of the second multiplier 105. Persons having ordinary skill in the art could understand that the analog-to-digital converter 1061 is provided for converting the analog signal outputted from the power adapter into a digital signal, and the fourth multiplier 1062 is provided for multiplying a set factor with the signal outputted by the analog-to-digital converter 1061 to obtain the second electrical signal U2 to be outputted to the second multiplier 105.

Figure 2:
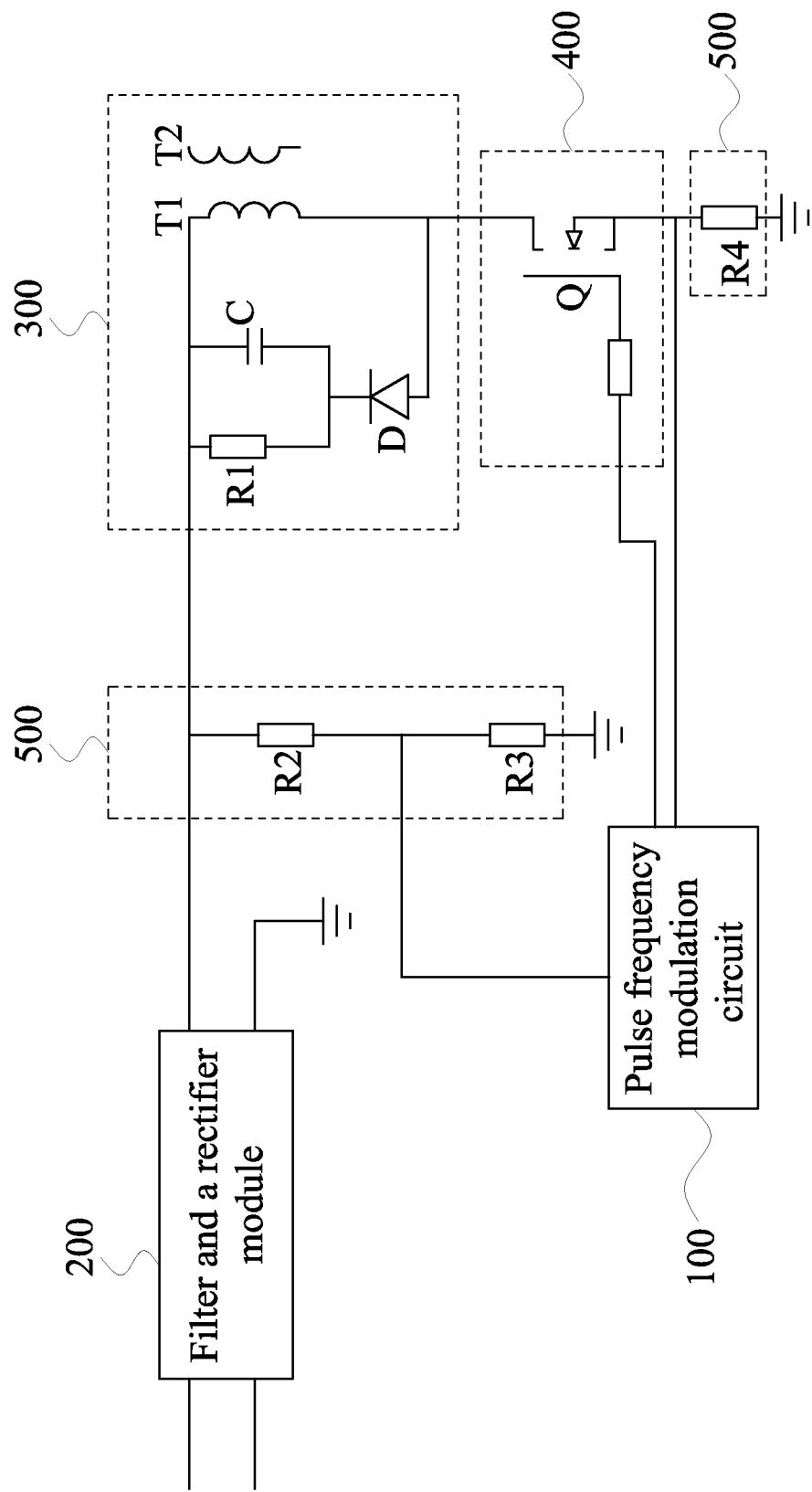
FIG. 2 is a schematic circuit diagram of a power adapter circuit in accordance with a second preferred embodiment of the present invention.

With reference to FIG. 2 for a power adapter in accordance with the second preferred embodiment of the present invention, the power adapter comprises a power adapter circuit and a pulse frequency modulation circuit of the first preferred embodiment.

The power adapter circuit comprises a sample module 500, a control module 400 and a filter and rectifier module, a power conversion module 300 and an output module sequentially and electrically coupled to one another. The pulse frequency modulation circuit includes two input terminals coupled to the sample module 500, and the pulse frequency modulation circuit further includes an output terminal, a control module 400 and a power conversion module 300 sequentially and electrically coupled to one another. Persons having ordinary skill in the art could understand that the pulse frequency modulation circuit of the first preferred embodiment the present invention receives an electrical signal of the power adapter circuit to obtain a control signal after the electrical signal is processed, and transmits the control signal to the control module 400 of the power adapter circuit. The control module 400 changes the status according to the control signal to modulate the output voltage of the power conversion module 300, so as to change the operating voltage of the input module and achieve the effects of switching and adjusting the operating status of the power adapter. Since the pulse frequency modulation circuit of the first preferred embodiment can output the modulation frequency precisely, therefore the timing for switching the operating status of the power adapter can be controlled precisely.

The power conversion circuit comprises a first resistor R1, a capacitor C, a diode D, a primary inductor T1 and a secondary inductor T2, and the primary inductor T1 and the filter and rectifier module circuit are coupled to the secondary inductor T2 and the output module circuit, and the diode D has a cathode serially coupled to the capacitor C to form a serial circuit coupled to both ends of the primary inductor T1, and the first resistor R1 and the capacitor C are coupled in parallel to each other. Persons having ordinary skill in the art could understand that the control module 400 changes the ON status according to the control signal outputted from the pulse frequency modulation circuit to change voltage of the primary inductor T1 and the induced voltage of the secondary inductor T2, so as to achieve the effect of modulating the output voltage.

The control module 400 includes a transistor Q having a base coupled to an output terminal of the third multiplier 104 of the pulse frequency modulation circuit of the first preferred embodiment for receiving the control signal outputted from the pulse frequency modulation circuit, an emitter coupled to a second input terminal of the second multiplier 105 of the pulse frequency modulation circuit of the first preferred embodiment, and a collector coupled to the primary inductor T1 for controlling the voltage of the primary inductor T1.

The sample module 500 includes a second resistor R2, a third resistor R3 and a fourth resistor R4, and the second resistor R2 and the third resistor R3 are coupled in series with each other to form a serial circuit with an end coupled to the primary inductor T1 and the other end grounded. The first input terminal of the second multiplier 105 of the pulse frequency modulation circuit of the first preferred embodiment is coupled between the second resistor R2 and third resistor R3 for receiving the second electrical signal U2 which serves as a sample signal for the computation, and an end of the fourth resistor R4 is coupled to a second input terminal of the second multiplier 105 of the pulse frequency modulation circuit of the first preferred embodiment, so that the pulse frequency modulation circuit can receives the third electrical signal U3 which serves as a sample signal for the computation.

While the invention has been described by means of specific embodiments, numerous modifications and variations could be made thereto by those skilled in the art without departing from the scope and spirit of the invention set forth in the claims.

What is claimed is:

1. A power adapter, comprising a power adapter circuit and a pulse frequency modulation circuit, the pulse frequency modulation circuit comprising a first multiplier, a second multiplier, a third multiplier, a divider and an adder sequentially and electrically coupled to one another, an output terminal of the second multiplier being coupled to another input terminal of the divider; the second multiplier having a first input terminal and a second input terminal; and the second input terminal of the second multiplier being coupled to another input terminal circuit of the adder, and the power adapter circuit comprising a sample module, a control module, and a filter and rectifier module, a power conversion module and an output module sequentially and electrically coupled to one another; and the pulse frequency modulation circuit having two input terminals coupled to the sample module; an output terminal of the pulse frequency modulation circuit, a control module and a power conversion module sequentially and electrically coupled to one another.

2. The power adapter of claim 1, wherein the power conversion module comprises a first resistor, a capacitor, a diode, a primary inductor and a secondary inductor; the primary inductor is coupled to the filter and rectifier module, and the secondary inductor is coupled to the output module; and the diode has a cathode coupled in series with the capacitor to form a serial circuit coupled to both ends of the primary inductor, and the first resistor is coupled in parallel with the capacitor.

3. The power adapter of claim 2, wherein the control module comprises a transistor having a base coupled to an output terminal of the third multiplier of the pulse frequency modulation circuit, an emitter coupled to the second input terminal of the second multiplier of the pulse frequency modulation circuit, and a collector coupled to the primary inductor.

4. The power adapter of claim 3, wherein the sample module comprises a second resistor, a third resistor and a fourth resistor, and the second resistor and the third resistor are coupled in series with each other to form a serial circuit with an end coupled to the primary inductor and the other end being grounded, and the first input terminal of the second multiplier of the pulse frequency modulation circuit is coupled between the second resistor and the third resistor, and an end of the fourth resistor is coupled to the second input terminal of the second multiplier of the pulse frequency modulation circuit and an another end of the fourth resistor is grounded.

5. A power adapter, comprising a power adapter circuit and a pulse frequency modulation circuit, the power adapter circuit comprising a sample module, a control module, and a filter and rectifier module, a power conversion module and an output module sequentially and electrically coupled to one another; and the pulse frequency modulation circuit having two input terminals coupled to the sample module; an output terminal of the pulse frequency modulation circuit, a control module and a power conversion module sequentially and electrically coupled to one another, the pulse frequency modulation circuit comprising a first multiplier, a second multiplier, a third multiplier, a divider and an adder sequentially and electrically coupled to one another, an output terminal of the second multiplier being coupled to another input terminal of the divider; the second multiplier having a first input terminal and a second input terminal; and the second input terminal of the second multiplier being coupled to another input terminal circuit of the adder; the pulse frequency modulation circuit further comprising an analog-to-digital converter and a fourth multiplier coupled in series with each other, and the analog-to-digital converter having an input terminal coupled to an output terminal of a power adapter; and the fourth multiplier having an output terminal coupled to the first input terminal of the second multiplier.

6. The power adapter of claim 5, wherein the power conversion module comprises a first resistor, a capacitor, a diode, a primary inductor and a secondary inductor; the primary inductor is coupled to the filter and rectifier module, and the secondary inductor is coupled to the output module; and the diode has a cathode coupled in series with the capacitor to form a serial circuit coupled to both ends of the primary inductor, and the first resistor is coupled in parallel with the capacitor.

7. The power adapter of claim 6, wherein the control module comprises a transistor having a base coupled to an output terminal of the third multiplier of the pulse frequency modulation circuit, an emitter coupled to the second input terminal of the second multiplier of the pulse frequency modulation circuit, and a collector coupled to the primary inductor.

8. The power adapter of claim 7, wherein the sample module comprises a second resistor, a third resistor and a fourth resistor, and the second resistor and the third resistor are coupled in series with each other to form a serial circuit with an end coupled to the primary inductor and the other end being grounded, and the first input terminal of the second multiplier of the pulse frequency modulation circuit is coupled between the second resistor and the third resistor, and an end of the fourth resistor is coupled to the second input terminal of the second multiplier of the pulse frequency modulation circuit and an another end of the fourth resistor is grounded.

* * * * *